(12) United States Patent
Inoue et al.

(10) Patent No.: US 10,009,997 B2
(45) Date of Patent: Jun. 26, 2018

(54) METAL-CLAD LAMINATE AND PRINTED WIRING BOARD (75) Inventors: Hiroharu Inoue, Osaka (JP); Koji Kishino, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 14/126,837

(22) PCT Filed: Jun. 12, 2012

(86) PCT No.: PCT/JP2012/003811
§ 371 (c)(1),
(2), (4) Date: Dec. 16, 2013

(87) PCT Pub. No.: WO2012/172776
PCT Pub. Date: Dec. 20, 2012

(65) Prior Publication Data
US 2014/0116764 A1 May 1, 2014

(30) Foreign Application Priority Data
Jun. 17, 2011 (JP) ................................ 2011-134899

(51) Int. Cl.
*H05K 1/00* (2006.01)
*H05K 1/09* (2006.01)
(Continued)

(52) U.S. Cl.
CPC ............ *H05K 1/036* (2013.01); *B32B 15/08* (2013.01); *B32B 27/08* (2013.01); *B32B 27/20* (2013.01);
(Continued)

(58) Field of Classification Search
CPC .......... H05K 1/00; H05K 1/036; H05K 3/022; H05K 2201/068; H05K 3/4644; H05K 3/4652
(Continued)

(56) References Cited

U.S. PATENT DOCUMENTS 4,420,509 A * 12/1983 Barrell .................... B29C 70/50
427/206
4,446,173 A * 5/1984 Barrell .................... B29C 70/50
427/206
(Continued)

FOREIGN PATENT DOCUMENTS

JP 61-82496 A 4/1986
JP 04-24985 A 1/1992
(Continued)

OTHER PUBLICATIONS

Taiwan Office Action and Search Report issued in corresponding Taiwanese Patent Application No. 101121542, dated Feb. 12, 2015; 6 pages with partial English translation.
(Continued)

*Primary Examiner* — Timothy Thompson
*Assistant Examiner* — Rhadames J Alonzo Miller
(74) *Attorney, Agent, or Firm* — McDermott Will & Emery LLP (57) ABSTRACT

A metal-clad laminate according to the invention is provided with an insulating layer and a metal layer present on at least one surface side of the insulating layer. The insulating layer is formed by laminating at least two layers, which are a first resin layer and a second resin layer disposed between the first resin layer and the metal layer. The first resin layer and the second resin layer each include a cured product of a resin composition. The resin composition in the first resin layer is different from the resin composition in the second resin
(Continued)

layer. A relative permittivity of the cured product of the resin composition included in the second resin layer is lower than a relative permittivity of the cured product of the resin composition included in the first resin layer.

11 Claims, 1 Drawing Sheet (51) Int. Cl.
   B32B 7/02     (2006.01)
   B32B 17/10    (2006.01)
   H05K 1/03     (2006.01)
   B32B 15/08    (2006.01)
   B32B 27/08    (2006.01)
   B32B 27/20    (2006.01)
   B32B 27/26    (2006.01)
   H05K 3/02     (2006.01)

(52) U.S. Cl.
   CPC .......... *B32B 27/26* (2013.01); *B32B 2250/40* (2013.01); *B32B 2264/102* (2013.01); *B32B 2307/204* (2013.01); *B32B 2307/206* (2013.01); *B32B 2457/08* (2013.01); *H05K 3/022* (2013.01); *Y10T 428/269* (2015.01)

(58) Field of Classification Search
   USPC .................. 174/250, 257, 258; 428/212, 339
   See application file for complete search history.

(56) References Cited

U.S. PATENT DOCUMENTS

| | | | | |
|---|---|---|---|---|
| 4,738,890 A * | 4/1988 | Tohrin | ..................... | B29B 15/10 428/196 |
| 4,803,022 A * | 2/1989 | Barrell | ..................... | B29C 35/12 156/275.5 |
| 4,937,133 A * | 6/1990 | Watanabe | ............ | C08G 73/106 174/254 |
| 5,436,062 A * | 7/1995 | Schmidt | ................. | H05K 1/115 174/254 |
| 6,562,179 B1 * | 5/2003 | Ikeguchi | ............ | C08G 59/4014 156/307.5 |
| 6,720,077 B2 * | 4/2004 | Hirai | ........................ | B32B 15/08 428/416 |
| 7,087,296 B2 * | 8/2006 | Porter | .................... | B29C 66/721 428/223 |
| 2002/0012780 A1 * | 1/2002 | Yuyama | .................. | B32B 15/08 428/216 |
| 2003/0068520 A1 * | 4/2003 | Ikegawa | ............. | H05K 1/0366 428/626 |
| 2004/0039127 A1 | 2/2004 | Amou et al. | | |
| 2005/0042466 A1 * | 2/2005 | Ohno | ................... | C08G 65/485 428/457 |
| 2007/0042202 A1 * | 2/2007 | Park | ........................ | B32B 15/08 428/458 |
| 2007/0169886 A1 * | 7/2007 | Watanabe | ............... | B32B 15/08 156/325 |
| 2009/0017308 A1 * | 1/2009 | Kitano | ........................ | C08J 5/24 428/414 |
| 2009/0101393 A1 * | 4/2009 | Kim | ......................... | B32B 15/08 174/254 |
| 2009/0312960 A1 * | 12/2009 | Dang | ................... | G06F 17/5018 702/42 |
| 2010/0129676 A1 * | 5/2010 | Fujimoto | ................ | B32B 15/14 428/462 |
| 2011/0074046 A1 * | 3/2011 | Sunohara | .......... | H01L 23/49822 257/778 |
| 2011/0135911 A1 * | 6/2011 | Maenaka | ................ | B32B 27/20 428/327 |
| 2011/0165410 A1 * | 7/2011 | Aoyagi | .................... | B32B 15/08 428/325 |
| 2012/0243186 A1 * | 9/2012 | Kim | ......................... | B32B 15/08 361/750 |
| 2013/0037310 A1 * | 2/2013 | Kimura | ...................... | C08J 5/24 174/251 |
| 2013/0213696 A1 * | 8/2013 | Yamamoto | ............. | H05K 3/386 174/254 |
| 2013/0242520 A1 * | 9/2013 | Onozuka | ................... | B32B 5/02 361/783 |

FOREIGN PATENT DOCUMENTS

| | | |
|---|---|---|
| JP | 04-24986 A | 1/1992 |
| JP | 4-24996 A | 1/1992 |
| JP | 05-167211 A | 7/1993 |
| JP | 07-232403 A | 9/1995 |
| JP | 07232403 A * | 9/1995 |
| JP | 08-090713 A | 4/1996 |
| JP | 08-153975 A | 6/1996 |
| JP | 08-186376 A | 7/1996 |
| JP | 2000-114726 A | 4/2000 |
| JP | 2003-023257 A | 1/2003 |
| JP | 2004-087639 A | 3/2004 |
| JP | 2004-342871 A | 12/2004 |
| JP | 2006-059865 A | 3/2006 |
| JP | 2008-201124 A | 9/2008 |
| JP | 2008201124 A * | 9/2008 |
| TW | 360684 | 6/1999 |

OTHER PUBLICATIONS

International Search Report issued in International Application No. PCT/JP2012/003811 dated Sep. 4, 2012, with English Translation.

* cited by examiner

METAL-CLAD LAMINATE AND PRINTED WIRING BOARD

RELATED APPLICATIONS

This application is a national phase application of the U.S. National Phase under 35 U.S.C. § 371 of International Application No. PCT/JP2012/003811, filed on Jun. 12, 2012, which in turn claims the benefit of Japanese Application No. 2011-134899, filed on Jun. 17, 2011, the disclosures of which Applications are incorporated by reference herein.

TECHNICAL FIELD

The present invention relates to a metal-clad laminate and a printed wiring board manufactured by using the metal-clad laminate.

BACKGROUND ART

Following the miniaturization and thickness reduction of electronic devices, surface-mounted packages are finding widespread use as electronic components for the electronic devices. Examples of such electronic component packages include semiconductor packages in which an electronic component such as a semiconductor element is mounted on a substrate surface and the electronic component is sealed with a resin. More specific examples include semiconductor packages such as a BOC (Board On Chip).

The increase in the volume of information to be processed created a demand for increased integration of electronic components, such as carried semiconductor elements, in various electronic devices. Such increased integration of electronic components has been realized, for example, in a MCP (Multi Chip Package) in which a plurality of electronic components such as DRAM (Dynamic Random Access memory) or flash memories is carried in a single package. Such devices require a reduced loss during signal transmission and increased signal transmission speed in the circuits between the electronic components.

For example, printed wiring boards obtained by forming a circuit (wiring circuit) by partially removing a metal layer, such as a metal foil, disposed on the surface of a metal-clad laminate are used as substrates carrying such electronic components. Such a laminate is described, for example, in Patent Document 1.

Thus, Patent Document 1 describes a laminate including a conductive foil and an insulating layer that includes a crosslinked structural body of a predetermined structure, which is a cured product of a thermosetting resin composition, and has a permittivity of 3.1 to 20 at 1 GHz. According to Patent Document 1, an electronic component manufactured using the laminated board is a highly efficient component with a small dielectric loss.

Further, the substrates for carrying electronic components are required to have not only the increased signal transmission speed, but also other properties, such as a high heat resistance and adequate elastic modulus, and also high reliability.

Patent Document 1: Japanese Patent Application Publication No. 2004-87639

SUMMARY OF THE INVENTION

It is an objective of the present invention to provide a metal-clad laminate that makes it possible to realize an increased transmission speed and manufacture a highly reliable substrate. Another objective is to provide a printed wiring board manufactured using the metal-clad laminate.

A metal-clad laminate according to one aspect of the present invention includes an insulating layer and a metal layer present on at least one surface side of the insulating layer, wherein the insulating layer is formed by laminating at least two layers, which are a first resin layer and a second resin layer disposed between the first resin layer and the metal layer, the first resin layer and the second resin layer each include a cured product of a resin composition, the resin composition in the first resin layer is different from the resin composition in the second resin layer, and a relative permittivity of the cured product of the resin composition included in the second resin layer is less than a relative permittivity of the cured product of the resin composition included in the first resin layer.

A printed wiring board according to another aspect of the present invention is obtained by partially removing the metal layer of the metal-clad laminate to form a circuit.

Objectives, features, aspects, and merits of the present invention will be made more apparent by the detailed description below and appended drawings.

BEST MODE FOR CARRYING OUT THE INVENTION

In order to realize the aforementioned increase in transmission speed, the resin constituting the substrate can be changed to a resin with a low permittivity. However, the research conducted by the inventors demonstrates that where the resin constituting the substrate is simply changed to a resin with a low permittivity, sufficient heat resistance sometimes cannot be ensured, adequate modulus of elasticity cannot be ensured, and sufficient reliability required for the substrates used in packaged cannot be reached.

Accordingly, the inventors have conducted the below-described comprehensive research to obtain a metal-clad laminate in which the degradation of other characteristics such as heat resistance can be inhibited and the increased transmission speed can be realized.

The inventors examined the effect produced by relative permittivity of the insulating layer of a metal-clad laminate on a signal transmission loss. Based on the examination result, the inventors assumed that the decrease in relative permittivity of the cured product of the resin composition contained at a position close to the metal layer is more effective in reducing the signal transmission loss than the decrease in relative permittivity of the cured product of the resin composition contained in other portions. Therefore, it was assumed that the decrease in relative permittivity of the cured product of the resin composition contained at a position close to the metal layer effectively increases the signal transmission speed. As a result of the investigation based on such assumption, the inventors have conceived of the below-described invention.

Embodiments of the present invention are described below, but the present invention is not limited thereto.

The metal-clad laminate according to the present embodiment includes an insulating layer and a metal layer present on at least one surface side of the insulating layer, wherein the insulating layer is obtained by laminating at least two layers, namely, a first resin layer and a second resin layer disposed between the first resin layer and the metal layer, the first resin layer and the second resin layer each include a cured product of a respective resin composition, the resin composition in the first resin layer is different from the resin composition in the second resin layer, and the relative permittivity of the cured product of the resin composition included in the second resin layer is less than a relative permittivity of the cured product of the resin composition included in the first resin layer.

With such a configuration, a metal-clad laminate can be obtained such that makes it possible to realize an increased transmission speed and manufacture a highly reliable substrate. Further, a package obtained by using a substrate in which a wiring circuit is formed by partially removing the metal layer on the surface of the obtained metal-clad laminate makes it possible to reduce a signal transmission loss between electronic components carried on the substrate and to realize high-speed signal transmission.

The explanation of the above-described results is presented below.

In the metal-clad laminate according to the present embodiment, the relative permittivity of the cured product of the resin composition included in the second resin layer disposed between the first resin layer and the metal layer is less than the relative permittivity of the resin composition included in the first resin layer. Thus, the relative permittivity of the cured product of the resin composition included in the resin layer on the metal layer side is less than the relative permittivity of the cured product of the resin composition included in the resin layer on the side far from the metal layer. As a result, even if the first resin layer of the insulating layer is not constituted by the cured product of the resin composition with a low relative permittivity such that makes it possible to realize the increased signal transmission speed, the signal transmission loss in the wiring circuit formed by partially removing the metal layer can be reduced due to the presence of the second resin layer with a low relative permittivity.

Further, even though the relative permittivity of the cured product of the resin composition included in the first resin layer is not sufficiently low, as described hereinabove, to realize the increased signal transmission speed, where the relative permittivity of the cured product of the resin composition included in the second resin layer on the metal layer side is low, the signal transmission loss in the wiring circuit can be reduced. This is apparently why the necessity of selecting the cured product of the resin composition included in the first resin layer only from materials with a low relative permittivity is reduced, and a material with a high heat resistance and adequate elasticity can be used. Therefore, by laminating such first resin layer, it is possible to obtain a metal-clad laminate in which not only high-speed transmission of signals can be realized, but also high reliability can be attained.

The above-described results indicate that a metal-clad laminate can be obtained such that makes it possible to realize an increased transmission speed and manufacture a highly reliable substrate.

By contrast, the following trends are observed when the relative permittivity of the cured product of the resin composition included in the second resin layer disposed between the first resin layer and the metal layer is equal to or greater than the relative permittivity of the resin composition included in the first resin layer. For example, sufficient increase in transmission speed cannot be attained in a package obtained by using the substrate with the wiring circuit formed thereon, or a package with a sufficiently high reliability cannot be obtained. More specifically, when the cured product of a resin composition such that ensures high heat resistance and adequate elasticity is used as the first resin layer, where a cured product with a relative permittivity higher than that of the aforementioned cured product is used for the second resin layer, it is impossible to attain a sufficient increase in transmission speed. Further, when the relative permittivity of the cured product of the resin composition included in the second resin layer makes it possible to attain a sufficient increase in transmission speed, the cured product of the resin composition with a very low relative permittivity is to be used for the first resin layer. As a result, the heat resistance of the cured product of the resin composition included in the first resin layer is not sufficiently increased, or the adequate modulus of elasticity of the cured product is difficult to ensure. Thus a configuration with a sufficiently high reliability is difficult to obtain.

The relative permittivity referred to herein is a ratio of the permittivity $\in$ of the material to the vacuum permittivity $\in_0$, i.e., ($\in_r = \in / \in_0$). More specifically, for example, it is a relative permittivity measured at a frequency of 1 MHz under normal-temperature environment.

Figure 1:
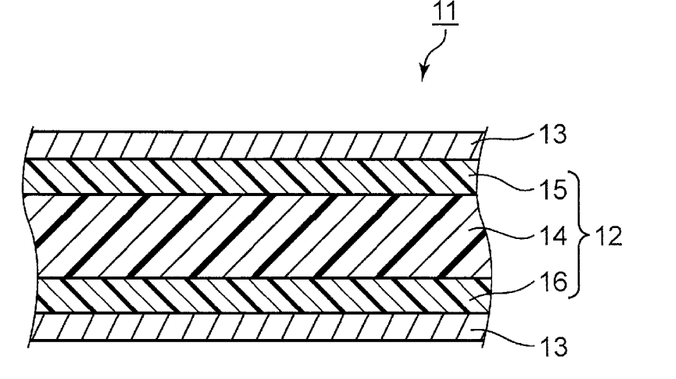
FIG. 1 is a schematic sectional view illustrating an example of the metal-clad laminate according to the present embodiment.

Other features of the metal-clad laminate according to the present embodiment are not particularly limited, provided that the abovementioned requirements are fulfilled. More specifically, a metal-clad laminate having a layered structure such as shown in FIG. 1 can be used. FIG. 1 is a schematic sectional view illustrating an example of a metal-clad laminate 11 according to the present embodiment.

For example, as shown in FIG. 1, the metal-clad laminate according to the present embodiment, can have an insulating layer 12 and a metal layer 13 present on the surface side of the insulating layer 12. Further, the insulating layer 12 can be obtained by laminating three layers, namely, a first resin layer 14, a second resin layer 15 present on one surface side of the first resin layer 14, and a third resin layer 16 present on the other surface side of the first resin layer 14. The metal layer 13 present on the surface side of the insulating layer 12 can be a metal layer directly formed on the surface of the insulating layer 12, such as shown in FIG. 1, or a metal layer provided on the surface side of the insulating layer 12, with another layer being interposed therebetween.

In the metal-clad laminate, the metal layer 13 may be disposed at both surface sides of the insulating layer 12, as shown in FIG. 1, or the metal layer 13 may be disposed only on any one side of the insulating layer 12. Although the metal layer 13 may be provided on at least either of the sides of the insulating layer 12, it is preferred that the metal layer 13 be disposed at both surface sides of the insulating layer 12. In such a case, by partially removing the surface metal layers, a metal-clad laminate can be obtained such that makes it possible to form a substrate with metal wirings formed on both surfaces.

The insulating layer 12 may be obtained by laminating at least two layers, namely, the first resin layer 14 and the second resin layer 15 disposed between the first resin layer 14 and the metal layer 13. Thus, when the metal layer 13 is disposed on either of two sides of the insulating layer 12 in the metal-clad laminate, such a laminate of two layers, namely, the first resin layer 14 and the second resin layer 15, may be used as the insulating layer 12. Further, a three-layer laminate including the first resin layer 14, the second resin layer 15, and the third resin layer 16 may be also used when the metal layer 13 is disposed on either of two sides of the insulating layer 12.

Further, the insulating layer 12 may also have a configuration such as shown in FIG. 1 in which the second resin layer 15 is disposed on one surface of the first resin layer 14, and the third resin layer 16 is disposed on the other surface. For example, when the metal layer 13 is disposed at both surface sides of the insulating layer 12, it is preferred that such a configuration in which at least three layers are laminated be used as the metal-clad laminate. In such a case, with respect to the third resin layer 16, it is preferred that the relationship between the first resin layer 14 and the third resin layer 16 be the same as the relationship between the first resin layer 14 and the second resin layer. Further, it is preferred that the metal-clad laminate satisfy the following requirements. More specifically, a metal-clad laminate is preferred in which the metal layer is disposed at both surface sides of the insulating layer, the insulating layer be configured by further laminating the third resin layer on the surface of the first resin layer on the side opposite that where the second resin layer is laminated, the first resin layer and the third resin layer include cured products of respective resin composition, the resin composition in the first resin layer be different from the resin composition in the third resin layer, and the relative permittivity of the cured product of the resin composition included in the third resin layer be lower than the relative permittivity of the cured product of the resin composition included in the first resin layer. As a result, it is possible to provide a metal-clad laminate that makes it possible to form a substrate with metal wirings formed on both surfaces, to realize the increase in transmission speed, and manufacture a highly reliable substrate.

The insulating layer 12 may be obtained by laminating at least two layers, namely, the first resin layer 14 and the second resin layer 15 disposed between the first resin layer 14 and the metal layer 13, and a layer other than the first resin layer 14, the second resin layer 15, and the third resin layer 16 may be also provided. More specifically, an intermediate layer may be provided between the second resin layer 15 and the first resin layer 14, or between the third resin layer 16 and the first resin layer 14 with the object of increasing adhesion of the first resin layer 14 and the second resin layer 15 or the third resin layer 16.

Further, an intermediate layer may be also provided between the insulating layer 12 and the metal layer 13, that is, between the second resin layer 15 and the metal layer 13, or between the third resin layer 16 and the metal layer 13 with the object of increasing adhesion of the metal layer 13 and the insulating layer 12. An intermediate layer may be provided between the insulating layer 12 and the metal layer 13, but it is preferred that the insulating layer 12 and the metal layer 13 be laminated directly. In such a case, the effect of inhibiting the decrease in signal transmission loss in the metal wiring formed by partially removing the metal layer 13 can be advantageously demonstrated.

The thickness of the insulating layer is not particularly limited and is preferably from 5 μm (inclusive) to 200 μm (inclusive). Where the insulating layer is too thin, the printed wiring board formed by partially removing the metal layer is too thin and the mechanical strength tends to be insufficient. Where the insulating layer is too thick, the metal-clad laminate tends to be difficult to manufacture. Further, where the insulating layer is too thick, the metal-clad laminate also becomes thicker, thereby making it difficult to reduce the substrate obtained from the metal-clad laminate or electronic device in size and thickness. Further, where the insulating layer thickness is within the aforementioned range, the reduction in size and thickness of the substrate obtained from a metal-clad laminate or an electronic device obtained as a finished product cannot be impaired, and moreover the decrease in mechanical strength caused by insufficient thickness can be inhibited sufficiently.

The thickness of the first resin layer, second resin layer, third resin layer, insulating layer, and metal-clad laminate can be measured by observing the cross section of the metal-clad laminate under a microscope.

Further, the first resin layer in the insulating layer is not particularly limited, provided it has the above-described configuration. More specifically, the first resin layer is not particularly limited, provided it includes the cured product of a resin composition, the resin composition is different from the resin composition in the second resin layer, and the relative permittivity of the cured product of the resin composition included in the second resin layer is less than the relative permittivity of the cured product of the resin composition included in the first resin layer. Further, when the metal-clad laminate is provided with the third resin layer, the relationship between the third resin layer and the first resin layer is the same as the relationship between the second resin layer and the first resin layer. More specifically, the first resin layer in the insulating layer in such a configuration is not particularly limited, provided that it includes the cured product of a resin composition, the resin composition is different from the resin composition in the third resin layer, and the relative permittivity of the cured product of the resin composition included in the third layer is less than the relative permittivity of the cured product of the resin composition included in the first layer.

The resin composition in the first resin layer is not particularly limited, provided that the relative permittivity of the cured product thereof is higher than the relative permittivity of the cured product of the resin composition included in the second layer. Thus, the resin composition included in the first resin layer is not particularly limited, provided that the relative permittivity of the cured product of the resin composition included in the second resin layer is less than the relative permittivity of the cured product of the resin composition included in the first layer.

The resin composition in the first resin layer is preferably such that the relative permittivity of the cured product of the resin composition included in the second layer is 20% to 90%, more preferably 30% to 90%, even more preferably 40% to 90% of the relative permittivity of the cured product of the resin composition included in the first resin layer. Where the resin composition in the first resin layer satisfies such a relationship with the resin composition in the second resin layer, the second resin layer on the metal layer side can further decrease the signal transmission loss in the wiring circuit formed by partially removing the metal layer. Furthermore, since the signal transmission loss can be reduced due to the presence of the second resin layer, a layer with high heat resistance or more adequate modulus of elasticity can be used as the first resin layer. Thus, a metal-clad laminate can be manufactured such that makes it possible to reduce further the signal transmission loss and manufacture a highly reliable substrate.

The relative permittivity of the cured product of the resin composition included in the first resin layer is not particularly limited, provided that the abovementioned relationship with the resin composition in the second resin layer is satisfied. For example, the relative permittivity of the cured product of the resin composition included in the first resin layer is preferably 2.2 to 10.0, more preferably 3.0 to 9.0, even more preferably 3.0 to 8.0. Further, it is preferred that the first resin layer be such that can sufficiently increase the reliability of the metal-clad laminate. Thus, provided that the relative permittivity of the cured product of the resin composition included in the first resin layer is within the above-described range, the resin composition included in the first resin layer can sufficiently increase the reliability of the metal-clad laminate. Further, by providing the second resin layer, it is possible to reduce further the signal transmission loss.

The first resin layer is not particularly limited, provided it includes the above-described cured product of the resin composition. Further, it is preferred that the first resin layer include the above-described cured product of the resin composition and also a fibrous base material. It is also preferred that the first resin layer be obtained by impregnating the fibrous base material with the resin composition in the first resin layer and curing the resin composition. In such a case, it is possible to provide a metal-clad laminate of higher reliability. The explanation of this result is provided below. By including the fibrous base material in addition to the cured product of the resin composition in the first resin layer, it is apparently possible to improve insulation reliability and bending ability. More specifically, it is apparently possible to inhibit the occurrence of defects such as cracks when the obtained metal-clad laminate is bent. Thus, since the occurrence of cracks or the like during bending can be inhibited, it is apparently possible to improve insulation reliability and also improve bending ability. As a result, it is apparently possible to manufacture an electronic component with higher reliability.

For example, a sheet-shaped fibrous base material can be used as the fibrous base material, but selection is not limited to this. Specific examples of the fibrous base material include woven fabric of inorganic fibers, such as glass cloth, nonwoven fabric of inorganic fibers, aramid cloth, polyester cloth, and paper. The thickness of the fibrous base material is not particularly limited but is preferably, for example, about 0.01 mm to 0.2 mm.

Further, the resin composition in the first resin layer is not particularly limited, provided that the above-described relationship is satisfied, but it is preferably a thermosetting compound. In such a case, a metal-clad laminate of higher reliability can be provided. The explanation of this result is provided below.

First, as a result of including a thermosetting compound as the resin composition in the first resin layer, the resin composition in the first resin layer can be advantageously cured and the advantageous first resin layer can be formed.

An epoxy compounds such as an epoxy resin is a specific example of the thermosetting compound. The resin composition in the first resin layer may include a thermosetting compound and also a curing agent.

Such an epoxy compound is not particularly limited and can be, for example, an epoxy compound having two or more epoxy groups in a molecule. Specific examples include bisphenol epoxy resins, novolac epoxy resins, phenol novolac epoxy resins, alicyclic epoxy resins, and heterocyclic epoxy resins. Those resins may be used individually or in combinations of two or more thereof.

The curing agent to be used is not particularly limited. Specific examples include curing agents capable of curing epoxy compounds, for example, imidazole curing agents.

Further, it is preferred that a radical-polymerizable thermosetting compound be included as the resin composition in the first resin layer. In such a case, a metal-clad laminate of higher reliability can be provided. The explanation of this result is provided below.

First, by including a radical polymerizable thermosetting compound as the resin composition in the first resin layer, it is apparently possible to cure advantageously the resin composition in the first resin layer, thereby forming an advantageous first resin layer. Further, when the first resin layer includes a fibrous base material such as glass cloth, the first resin layer is obtained by impregnating the fibrous base material with the resin composition and curing the resin composition. Where the radical polymerizable thermosetting compound is included in this case as the resin composition in the first resin layer, this resin composition excels in impregnation ability with respect to the fibrous base material and a more advantageous first resin layer can be formed. This is apparently why it is possible to provide a metal-clad laminate of higher reliability. Furthermore, by including the radical polymerizable thermosetting compound, it is possible to cure advantageously the resin composition in the first resin layer and the continuous production of the metal-clad laminate is facilitated.

The radical polymerizable thermosetting compound is not particularly limited. Further, a radical polymerizable thermosetting monomer and a radical polymerizable thermosetting resin can be used as the radical polymerizable thermosetting compound.

Examples of the radical polymerizable thermosetting monomers include monomers having at least one radical polymerizable unsaturated group in a molecule. Specific examples of such monomers include styrene, methyl styrene, halogenated styrene, (meth)acrylic acid, methyl methacrylate, ethyl methacrylate, butyl acrylate, divinylbenzene, ethylene glycol di(meth)acrylate, propylene glycol di(meth)acrylate, trimethylol propane tri(meth)acrylate, pentaerythritol tri(meth)acrylate, and pentaerythritol tetra(meth)acrylate. Those monomers may be used individually or in combinations or two or more thereof.

Examples of the radical polymerizable thermosetting resins include resins having at least two radical polymerizable unsaturated groups in a molecule. Specific examples include vinyl ester resins which are reaction products of epoxy resins and an unsaturated fatty acid such as acrylic acid or methacrylic acid, unsaturated polyesters which are reaction products of propylene glycol or bisphenol A propylene oxide adduct with a polybasic unsaturated acid such as maleic anhydride and fumaric acid, and bisphenol A methacrylate. Those resins may be used individually or in combinations of two or more thereof.

When such a radical polymerizable thermosetting compound is used, it is preferred that the resin composition include a radical polymerization initiator. Specific examples of the radical polymerization initiator include ketone peroxides such as methyl ethyl ketone peroxide, methyl isobutyl ketone peroxide, and cyclohexanone peroxide, diacyl peroxides such as benzoyl peroxide and isobutyl peroxide, hydroperoxides such as cumene hydroperoxide (CHP) and t-butyl hydroperoxide, dialkyl peroxides such as dicumyl peroxide and di-t-butylperoxide, peroxyketals such as 1,1-di-t-butylperoxy-3,3,5-trimethylcyclohexanone and 2,2-di-(t-butylperoxy)-butane, alkyl peresters such as t-butyl perbenzoate and t-butylperoxy-2-ethyl hexanoate, organic peroxides of percarbonates such as bis(4-t-butylcyclohexyl) peroxydicarbonate and t-butylperoxyisobutyl carbonate, and inorganic peroxides such as hydrogen peroxide. Those compounds may be used individually or in combinations of two or more thereof.

The resin composition in the first resin layer may also include an elastomer or an inorganic filler.

The elastomer is not particularly limited. Examples of suitable elastomers include liquid rubbers of low volatility such as liquid polybutadiene and liquid NBR, and crosslinked or non-crosslinked rubber particles such as NBR rubber, SBR rubber, acrylic rubber, and silicone rubber.

The inorganic filler is not particularly limited, and for example spherical silica and alumina can be used. The content of the inorganic filler is preferably such that the relative permittivity of the cured product of the resin composition included in the first resin layer satisfy the above-described relationship.

Further, the resin composition in the first resin layer is preferably a liquid resin composition. Where a liquid resin composition is used as the resin composition in the first resin layer, continuous production of the metal-clad laminate is facilitated.

It is further preferred that the resin composition in the first resin layer include no solvent, that is, be a solvent-free resin composition. In such a case, continuous production of the metal-clad laminate is facilitated.

The second resin layer in the insulating layer is not particularly limited, provided that the above-descried conditions are fulfilled. More specifically, the second resin layer is not particularly limited, provided that it includes the cured product of a resin composition, the resin composition is different from the resin composition in the first resin layer, and the relationship of the relative permittivity of the cured product of the resin composition included in the second resin layer being lower than the relative permittivity of the resin composition included in the first resin layer is satisfied. Further, it is preferred that such a relationship be satisfied not only between the first resin composition and the second resin composition, but also between the first resin composition and the third resin composition when the third resin layer is provided.

Further, the second resin layer and the third resin layer may have the same composition or different compositions, provided that the above-described relationship is satisfied.

The relative permittivity of the cured product of the resin composition included in the second resin layer is preferably 2.2 to 3.5. Where the second resin layer is such that the cured product of the resin composition included therein has the relative permittivity in such a range, a greater effect produced by the second resin layer, that is, the decrease in signal transmission loss in the wiring circuit formed by partially removing the metal layer, can be demonstrated while inhibiting the occurrence of adverse effects such as excessive decrease in the heat resistance of the second resin layer. Further, when the third resin layer is provided, it is also preferred that the relative permittivity of the cured product of the resin composition included in the third resin layer be 2.2 to 3.5, in the same manner as in the case of the second resin layer.

The thickness of the second resin layer is preferably 5% to 50% of the thickness of the first resin layer. More specifically, it is preferred that the thickness of the second resin layer be 1 μm to 25 μm. As a result of forming the second resin layer to such a thickness, it is possible to decrease further the signal transmission loss in the wiring circuit formed by partially removing the metal layer on the surface of the obtained metal-clad laminate. Further, where the third resin layer is provided, the thickness of the third resin layer is preferably 5% to 50% of the thickness of the first layer, in the same manner as in the case of the second resin layer. More specifically, it is preferred than the thickness of the third resin layer be 1 μm to 25 μm.

The resin composition in the second resin layer is not particularly limited, provided that it satisfies the above-described relationship and is different from the resin composition in the first resin layer. It is, however, preferred that the resin composition in the second resin layer include a thermosetting compound. The resin composition in the third resin layer is not particularly limited, provided that it satisfies the above-described relationship and is different from the resin composition in the first resin layer. Further, it is preferred that the resin composition in the third resin layer include a thermosetting compound, similarly to the resin composition in the second resin layer.

The thermosetting compound is not particularly limited, provided that the resin composition in the second resin layer satisfies the above-described relationship. Specific examples include epoxy compounds such as epoxy resins, and thermosetting compounds that produce cured products with a relative permittivity lower than those of cured products of epoxy compounds.

The epoxy compounds are not particularly limited. For example, an epoxy compound having two or more epoxy groups in a molecule, such that produces a cured product with a relative permittivity lower than that of the cured product of the resin composition included in the first resin layer, can be advantageously used. More specific examples include cresol novolac epoxy resins, bisphenol F epoxy resins, phenol novolac epoxy resins, dicyclopentadiene epoxy resins, biphenyl epoxy resins, naphthalene epoxy, bisphenol A epoxy resins, and phenol aralkyl epoxy resins. Those resins may be used individually or in combinations of two or more thereof.

Thermosetting compounds that produce cured products with a relative permittivity lower than those of cured products of epoxy compounds are not particularly limited. Specific examples thereof include polyphenylene ether resins and cyanate resins.

The resin composition in the second resin layer and the third resin layer may include an inorganic filler. The inorganic filler is not particularly limited and may be, for example, spherical silica and alumina. The content of the inorganic filler is preferably such that the relative permittivity of the cured product of the resin composition included in the second resin layer and the relative permittivity of the cured product of the resin composition included in the third resin layer satisfy the above-described relationship.

Further, the second resin layer and the third resin layer may include at least the cured products of resin compositions such as described hereinabove, and may include no fibrous base material. Thus, the second resin layer and the third resin layer may be layers constituted by the cured products of resin compositions. Further, it is preferred that the second resin layer and the third resin layer be layers constituted by the cured products of resin compositions.

The metal layer in the metal-clad laminate is not particularly limited. More specifically, a metal foil can be used as the metal layer of the metal-clad laminate. For example, a copper foil such as an electrolytic copper foil can be the metal foil. The thickness of the metal foil is not particularly limited, but is preferably, for example, 2 μm to 35 μm. An electrolytic copper foil (3EC-VLP, thickness 12 μm, manufactured by Mitsui Mining and Smelting Co., Ltd.) is a specific example of the metal layer.

In the metal-clad laminate, the metal layer may be disposed on one surface of the insulating layer or may be disposed on both surfaces of the insulating layer. The configuration in which the metal layer is disposed on both surfaces of the insulating layer is preferred. With such a configuration, a substrate in which a metal wiring is formed on both surfaces can be formed by partially removing the surface metal layers. Further, it is thus possible to obtain a highly reliable metal-clad laminate in which a metal wiring can be formed on both surfaces. Further, highly reliable electronic components can be manufactured by using such a metal-clad laminate.

A method for manufacturing the metal-clad laminate is not particularly limited, provided that the metal-clad laminate of the above-described configuration can be manufactured. More specifically, the following method can be used.

First, a fibrous base material is impregnated with the resin composition in the first resin layer. The impregnation can be performed, for example, by dipping or coating. A prepreg for forming the first resin layer can thus be obtained.

A resin composition in the second resin layer is then coated on a metal foil serving as a metal layer. The metal foil coated with the resin composition is laminated in a manner such that the resin composition comes into contact with one surface of the prepreg for forming the first resin layer. Further, when a third resin layer is provided, the resin composition in the third resin layer is coated on the metal foil serving as a metal layer. The metal foil coated with the resin composition is laminated in a manner such that the resin composition comes into contact with the other surface of the prepreg for forming the first resin layer.

The laminate including the prepreg is then dried and heated. As a result, the resin compositions contained in the layers are thermally cured and a metal-clad laminate is obtained.

In the method explained hereinabove, the resin compositions constituting the second resin layer and the third resin layer are initially coated on the metal foil, but such a method is not limiting and, for example, the following method may be also used. Thus, a method may be used in which the resin compositions constituting the second resin layer and the third resin layer are initially coated on the prepreg for forming the first resin layer, rather than on the metal foil, and the metal foils are then laminated on both surfaces of the coated prepreg.

A printed wiring board can be then obtained by forming a circuit by etching the metal layer in the obtained metal-clad laminate. Thus, where a circuit is formed by etching the metal layer of the obtained metal-clad laminate, it is possible to obtain a printed wiring board provided with conductive patterns as circuits on the surface of the laminate. The printed wiring board thus obtained can realize the increased transmission speed and has high reliability.

The present invention is explained below in greater detail on the basis of examples thereof, but the present invention is not limited to those examples.

EXAMPLES

Example 1

A resin composition constituted by 35 parts by mass of bisphenol A methacrylate (NK Oligo EA1020, manufactured by Shin-Nakamura Chemical Co., Ltd.), 35 parts by mass of phenol novolac epoxy resin (EPICLON N740, epoxy resin having two or more epoxy groups in a molecule, manufactured by DIC Corp.), 30 parts by mass of styrene which is a radical polymerizable thermosetting monomer (manufactured by Shin Nittetsu Chemical Co.), 1 part by mass of cumene hydroperoxide (CHP) which is a radical polymerization initiator (Percumyl H-80, manufactured by Nippon Oils and Fats Co., Ltd.), 1 part by mass of 2-ethyl-4-methyl imidazole (2E4MZ) which is a curing agent (manufactured by Shikoku Chemicals Corp.), 75 parts by mass of aluminum hydroxide particles which are an inorganic filler (CL303, manufactured by Sumitomo Chemical Co., Ltd.), 65 parts by mass of silica particles which are an inorganic filler (SO25R, manufactured by Admatechs Co., Ltd.), and 18 parts by mass of a cyclic phosphazene compound (SPB100, manufactured Otsuka Chemical Co., Ltd.) was prepared as a resin composition in the first resin layer. Then, a prepreg (resin-impregnated base material) obtained by impregnating glass cloth (1504 type, flat woven) was prepared for forming the first resin layer.

An electrolytic copper foil (3EC-VLP, thickness 12 μm, manufactured by Mitsui Metal and Mining Co. Ltd.) was prepared as a metal foil for a metal layer.

A resin composition constituted by 70 parts by mass of polyphenylene ether (Noryl 640-111, manufactured by SABIC Innovative Plastics Co.), 30 parts by mass of triallylisocyanate (TAIC, manufactured by Nippon Kasei Chemical Co., Ltd.), and 2 parts by mass of α,α'-bis(t-butylperoxy-m-isopropyl)benzene, which is a radical polymerization initiator (Perbytyl-P, manufactured by Nippon Oils and fats Co., Ltd.) was prepared as a resin composition in the second resin layer. When the second resin layer was formed, toluene was added to this resin composition to obtain a concentration of solids of 40 mass %, and the resin composition was used in the form of varnish.

A resin composition identical to the resin composition in the second resin layer was used as the resin composition in the third resin layer. When the third resin layer was formed, toluene was added to the resin composition, in the same manner as in the formation of the second resin layer, to obtain a concentration of solids of 40 mass %, and the resin composition was used in the form of varnish.

The resin composition in the second resin layer was then coated to a thickness of 10 μm on the metal foil.

The resin composition in the third resin layer was coated on a separate metal foil to a thickness of 10 μm.

The metal foils coated with those resin compositions were laminated to be in contact with respective surfaces of the prepreg for forming the first resin layer.

The laminate obtained was dried for 15 min at 110° C. and then heated for 15 min at 200° C.

As a result, the resin compositions included in the layers were thermally cured and a metal-clad laminate was obtained.

The relative permittivity of the cured product of the resin composition included in the first resin layer in the obtained metal-clad laminate was 5.2, the relative permittivity of the cured product of the resin composition included in the second resin layer was 2.6, and the relative permittivity of the cured product of the resin composition included in the third resin layer was 2.6. Further, the ratio of the relative permittivity of the cured product of the resin composition included in the second resin layer to the relative permittivity of the cured product of the resin composition included in the first resin layer was 50%. The relative permittivity was measured at a frequency of 1 MHz under normal-temperature environment by the method conforming to JIS C6481. More specifically, the measurements were performed using a LCR meter manufactured by Hewlett-Packard Corp.

The first resin layer, second resin layer, third resin layer, and metal-clad laminate has a thickness of 80 μm, 10 μm, 10 μm, and 124 μm, respectively. Those thicknesses were measured by microscopic observations of the cross section of the obtained metal-clad laminate.

Example 2

A metal-clad laminate was manufactured in the same manner as in Example 1, except that a resin composition constituted by 67 parts by mass of cresol novolac epoxy resin (N690, manufactured by DIC Corp.), 33 parts by mass of phenolic curing agent (TD2090, manufactured by DIC Corp.), 0.04 parts by mass of 2-ethyl-4-methyl imidazole (2E4MZ) which is a curing agent (manufactured by Shikoku Chemicals Corp.), 20 parts by mass of aluminum hydroxide particles which are an inorganic filler (CL303, manufactured by Sumitomo Chemical Co., Ltd.), and 100 parts by mass of silica particles which are an inorganic filler (SO25R, manufactured by Admatechs Co., Ltd.) was used for the resin composition in the second resin layer and the resin composition in the third resin layer.

The relative permittivity of the cured product of the resin composition included in the first resin layer in the obtained metal-clad laminate was 5.2, the relative permittivity of the cured product of the resin composition included in the second resin layer was 4.0, and the relative permittivity of the cured product of the resin composition included in the third resin layer was 4.0. Further, the ratio of the relative permittivity of the cured product of the resin composition included in the second resin layer to the relative permittivity of the cured product of the resin composition included in the first resin layer was 77%.

The first resin layer, second resin layer, third resin layer, and metal-clad laminate has a thickness of 80 μm, 10 μm, 10 μm, and 124 μm, respectively.

The relative permittivity and thickness of each layer were measured by the same methods as those of Example 1.

Example 3

A metal-clad laminate was manufactured in the same manner as in Example 1, except that a resin composition constituted by 67 parts by mass of cresol novolac epoxy resin (N690, manufactured by DIC Corp.), 33 parts by mass of phenolic curing agent (TD2090, manufactured by DIC Corp.), 0.04 parts by mass of 2-ethyl-4-methyl imidazole (2E4MZ) which is a curing agent (manufactured by Shikoku Chemicals Corp.), and 120 parts by mass of aluminum hydroxide particles which are an inorganic filler (CL303, manufactured by Sumitomo Chemical Co., Ltd.) was used for the resin composition in the second resin layer and the resin composition in the third resin layer.

The relative permittivity of the cured product of the resin composition included in the first resin layer in the obtained metal-clad laminate was 5.2, the relative permittivity of the cured product of the resin composition included in the second resin layer was 5.0, and the relative permittivity of the cured product of the resin composition included in the third resin layer was 5.0. Further, the ratio of the relative permittivity of the cured product of the resin composition included in the second resin layer to the relative permittivity of the cured product of the resin composition included in the first resin layer was about 96%.

The first resin layer, second resin layer, third resin layer, and metal-clad laminate has a thickness of 80 μm, 10 μm, 10 μm, and 124 μm, respectively.

The relative permittivity and thickness of each layer were measured by the same methods as those of Example 1.

Example 4

A metal-clad laminate was manufactured in the same manner as in Example 1, except that a resin composition constituted by 20 parts by mass of polyphenylene ether (Noryl 640-111, manufactured by SABIC Innovative Plastics Co.), 80 parts by mass of cresol novolac epoxy resin (N690, manufactured by DIC Corp.), and 0.04 parts by mass of 2-ethyl-4-methyl imidazole (2E4MZ) which is a curing agent (manufactured by Shikoku Chemicals Corp.) was used for the resin composition in the second resin layer and the resin composition in the third resin layer.

The relative permittivity of the cured product of the resin composition included in the first resin layer in the obtained metal-clad laminate was 5.2, the relative permittivity of the cured product of the resin composition included in the second resin layer was 3.5, and the relative permittivity of the cured product of the resin composition included in the third resin layer was 3.5. Further, the ratio of the relative permittivity of the cured product of the resin composition included in the second resin layer to the relative permittivity of the cured product of the resin composition included in the first resin layer was about 67%.

The first resin layer, second resin layer, third resin layer, and metal-clad laminate has a thickness of 80 μm, 10 μm, 10 μm, and 124 μm, respectively.

The relative permittivity and thickness of each layer were measured by the same methods as those of Example 1.

Comparative Example 1

A metal-clad laminate was manufactured in the same manner as in Example 1, except that a resin composition constituted by 67 parts by mass of cresol novolac epoxy resin (N690, manufactured by DIC Corp.), 33 parts by mass of phenolic curing agent (TD2090, manufactured by DIC Corp.), 0.04 parts by mass of 2-ethyl-4-methyl imidazole (2E4MZ) which is a curing agent (manufactured by Shikoku Chemicals Corp.), and 100 parts by mass of titanium oxide particles which are an inorganic filler (R820, manufactured by Ishihara Sangyo Kaisha, Ltd.) was used for the resin composition in the second resin layer and the resin composition in the third resin layer.

The relative permittivity of the cured product of the resin composition included in the first resin layer in the obtained metal-clad laminate was 5.2, the relative permittivity of the cured product of the resin composition included in the second resin layer was 8.4, and the relative permittivity of the cured product of the resin composition included in the third resin layer was 8.4.

The first resin layer, second resin layer, third resin layer, and metal-clad laminate has a thickness of 80 μm, 10 μm, 10 μm, and 124 μm, respectively.

The relative permittivity and thickness of each layer were measured by the same methods as those of Example 1.

Comparative Example 2

A metal-clad laminate was manufactured in the same manner as in Example 1, except that the second resin layer and the third resin layer were not provided.

Evaluation Method

The obtained copper-clad laminates (metal-clad laminates) were evaluated in the following manner.

Transmission Loss

Wiring circuits (metal wirings) with different circuit widths S and inter-circuit spacing W (the circuit width S was within a range of 0.06 mm to 0.35 mm, and the inter-circuit spacing W was 0.100 mm, 0.125 mm, and 0.150 mm) were formed on the obtained copper-clad laminate (length 11 mm×width 9 mm) to obtain an impedance of 50Ω at a frequency of 3 GHz. An electric signal of a frequency of 3 GHz was inputted to the metal wirings. The transmission loss of the electric signal inputted to the metal wirings during transmission in the metal wirings was measured.

The measurement results are described below. When the metal-clad laminate of Example 1 was used, the transmission loss was −3.3 dB. When the metal-clad laminate of Example 2 was used, the transmission loss was −3.8 dB. When the metal-clad laminate of Example 3 was used, the transmission loss was −4.2 dB. When the metal-clad laminate of Example 4 was used, the transmission loss was −3.6 dB. When the metal-clad laminate of Comparative Example 1 was used, the transmission loss was −5.2 dB. When the metal-clad laminate of Comparative Example 2 was used, the transmission loss was −4.3 dB.

Those results clearly indicate that the transmission loss in Examples 1 to 4 was less than in Comparative Examples 1 and 2. Therefore, it is clear that the increase in signal speed can be realized when the relative permittivity of the cured product of the resin composition included in the second resin layer is less than the relative permittivity of the cured product of the resin composition included in the first resin layer.

Further, in Examples 1, 2, and 4 in which the ratio of the relative permittivity of the cured product of the resin composition included in the second resin layer to the relative permittivity of the cured product of the resin composition included in the first resin layer is 20% to 90%, the transmission loss is less than that in Example 3 in which the ratio exceeds 90%. Therefore, it is preferred that the ratio of the relative permittivity of the cured product of the resin composition included in the second resin layer to the relative permittivity of the cured product of the resin composition included in the first resin layer be 20% to 90%.

Further, in Examples 1 and 4 in which the relative permittivity of the cured product of the resin composition included in the second resin layer is 2.2 to 3.5, the transmission loss is less than in Examples 2 and 3 in which the relative permittivity of the cured product of the resin composition included in the second resin layer exceeds 3.5. Therefore, it is preferred that the relative permittivity of the cured product of the resin composition included in the second resin layer be 2.2 to 3.5.

The present description discloses a variety of the aforementioned features, but the main features among them are summarized below.

The metal-clad laminate according to one aspect of the present invention includes an insulating layer and a metal layer present on at least one surface side of the insulating layer, wherein the insulating layer is formed by laminating at least two layers, which are a first resin layer and a second resin layer disposed between the first resin layer and the metal layer; the first resin layer and the second resin layer each include a cured product of a resin composition; the resin composition in the first resin layer is different from the resin composition in the second resin layer; and a relative permittivity of the cured product of the resin composition included in the second resin layer is less than a relative permittivity of the cured product of the resin composition included in the first resin layer.

With such a configuration, it is possible to provide a metal-clad laminate that makes it possible to realize an increased transmission speed and manufacture a highly reliable substrate. Further, a package obtained by using a substrate in which a wiring circuit is formed by partially removing the metal layer on the surface of the obtained metal-clad laminate makes it possible to reduce a signal transmission loss between electronic components carried on the substrate and to realize high-speed signal transmission.

Further, it is preferred that in the metal-clad laminate, the relative permittivity of the cured product of the resin composition included in the second resin layer be 20% to 90% of the relative permittivity of the cured product of the resin composition included in the first resin layer.

With such a configuration, the signal transmission loss in the wiring circuit formed by partially removing the metal layer can be further decreased.

Further, it is preferred that in the metal-clad laminate, the relative permittivity of the cured product of the resin composition included in the second resin layer be 2.2 to 3.5.

With such a configuration, the signal transmission loss in the wiring circuit formed by partially removing the metal layer can be further decreased.

Further, it is preferred that in the metal-clad laminate, the thickness of the second resin layer be 5% to 50% of the thickness of the first resin layer.

With such a configuration, the signal transmission loss in the wiring circuit formed by partially removing the metal layer can be further decreased.

Further, it is preferred that in the metal-clad laminate, the thickness of the second resin layer be 1 μm to 25 μm.

With such a configuration, the signal transmission loss in the wiring circuit formed by partially removing the metal layer can be further decreased.

Further, it is preferred that in the metal-clad laminate, the resin composition in the first resin layer include a thermosetting compound.

With such a configuration, it is possible to provide a metal-clad laminate with higher reliability.

Further, it is preferred that in the metal-clad laminate, the resin composition in the first resin layer include a radical polymerizable thermosetting compound.

With such a configuration, it is possible to provide a metal-clad laminate with higher reliability. Further, continuous production of the metal-clad laminate can be facilitated.

Further, it is preferred that in the metal-clad laminate, the first resin layer include a fibrous base material.

With such a configuration, it is possible to provide a metal-clad laminate with higher reliability. Further, where an electronic component is manufactured using the obtained metal-clad laminate, a highly reliable electronic component can be manufactured.

Further, it is preferred that in the metal-clad laminate, the resin composition in the first resin layer be a liquid resin composition.

With such a configuration, it is possible to provide a metal-clad laminate with higher reliability. Further, continuous production of the metal-clad laminate can be facilitated.

Further, it is preferred that in the metal-clad laminate, the resin composition in the second resin layer include a thermosetting compound.

With such a configuration, it is possible to provide a metal-clad laminate with higher reliability.

Further, it is preferred that in the metal-clad laminate, the thickness of the insulating layer is 5 μm to 200 μm.

With such a configuration, it is possible to provide a metal-clad laminate with higher reliability.

Further, it is preferred that in the metal-clad laminate, the metal layer be disposed at both surface sides of the insulating layer; the insulating layer include a third resin layer that is further laminated on a surface of the first resin layer on an opposite side to a side where the second resin layer is laminated; the first resin layer and the third resin layer include a cured product of a respective resin composition; the resin composition in the first resin layer be different from the resin composition in the third resin layer; and the relative permittivity of the cured product of the resin composition included in the third resin layer be lower than the relative permittivity of the cured product of the resin composition included in the first resin layer.

With such a configuration, a substrate with a metal wiring formed on both surface sides can be formed by partially removing the surface metal layer.

Further, a printed wiring board according to another aspect of the present invention is obtained by forming a circuit by partially removing the metal layer of the metal-clad laminate.

With such a configuration, it is possible to provide a highly reliable printed wiring board that makes it possible to realize an increased transmission speed.

INDUSTRIAL APPLICABILITY

The present invention provides a metal-clad laminate that makes it possible to realize an increased transmission speed and manufacture a highly reliable substrate. The present invention also provides a printed wiring board manufactured using the metal-clad laminate.

The invention claimed is:

1. A metal-clad laminate consisting of, as laminated layers:
an insulating layer;
a first metal layer present on one surface side of the insulating layer; and
a second metal layer present on another surface of the insulating layer, wherein:
the insulating layer consists of three layers, which are a first resin layer, a second resin layer and a third resin layer, the first resin layer being disposed between the second resin layer and the third resin layer, the second resin layer being disposed between the first resin layer and the first metal layer, and a third resin layer being disposed between the first resin layer and the second metal layer,
the first resin layer, the second resin layer and the third resin layer each include a cured product of a resin composition,
the resin composition in the first resin layer is different from the resin composition in each of the second resin layer and the third resin layer,
a relative permittivity of the cured product of the resin composition included in each of the second resin layer and the third resin layer is lower than a relative permittivity of the cured product of the resin composition included in the first resin layer,
the resin composition in the first resin layer includes an epoxy resin having two or more epoxy groups in a molecule, or a radical polymerizable thermosetting compound having at least one radical polymarizable unsaturated group in a molecule,
the resin composition in each of the second resin layer and the third resin layer includes a polyphenylene ether,
a thickness of each of the second resin layer and the third resin layer is 1 µm to 10 µm,
a thickness of the insulating layer is 5 µm to 200 µm, and
the relative permittivity of the cured product of the resin composition included in each of the second resin layer and the third resin layer is 20% to 50% of the relative permittivity of the cured product of the resin composition included in the first resin layer.

2. The metal-clad laminate according to claim 1, wherein the relative permittivity of the cured product of the resin composition included in each of the second resin layer and the third resin layer is 2.2 to 3.5.

3. The metal-clad laminate according to claim 1, wherein the thickness of each of the second resin layer and the third resin layer is 5% to 50% of a thickness of the first resin layer.

4. The metal-clad laminate according to claim 1, wherein the first resin layer includes a fibrous base material.

5. The metal-clad laminate according to claim 1, wherein the resin composition in the first resin layer is a liquid resin composition.

6. A printed wiring board obtained by partially removing at least one of the first metal layer and the second metal layer of the metal-clad laminate according to claim 1 to form a circuit.

7. The metal-clad laminate according to claim 1, wherein the radical polymerizable thermosetting compound includes styrene.

8. The metal-clad laminate according to claim 1, wherein a thickness of each of the first metal layer and the second metal layer is 2 µm to 35 µm.

9. The metal-clad laminate according to claim 1, wherein the thickness of the insulating layer is 5 µm to 100 µm.

10. The metal-clad laminate according to claim 1, wherein a total number of laminated layers in the metal-clad laminate is five.

11. The metal-clad laminate according to claim 1, wherein only three resin layers are laminated between the first metal layer and the second metal layer.

* * * * *